US006831291B2

United States Patent
Imai

(10) Patent No.: US 6,831,291 B2
(45) Date of Patent: Dec. 14, 2004

(54) PROCESS FOR PRODUCING ALTERNATE STRIPED ELECTRODE ARRAY IN WHICH TRANSPARENT ELECTRODES ALTERNATE WITH OPAQUE ELECTRODES, BASED ON SINGLE MASK DESIGNED FOR THE OPAQUE ELECTRODES IN SELF-ALIGNED MANNER

(75) Inventor: Shinji Imai, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 126 days.

(21) Appl. No.: 10/122,186

(22) Filed: Apr. 16, 2002

(65) Prior Publication Data
US 2002/0148989 A1 Oct. 17, 2002

(30) Foreign Application Priority Data

Apr. 16, 2001 (JP) ....................... 2001-116906
Jan. 28, 2002 (JP) ....................... 2002-017941

(51) Int. Cl.$^7$ ................................ H04N 1/00
(52) U.S. Cl. ......................... 250/591; 378/28
(58) Field of Search ................ 250/591, 580, 250/492.2, 370.08, 370.09; 378/28, 31; 257/447, E27.141; 438/690, 30, 940; 358/300

(56) References Cited

U.S. PATENT DOCUMENTS 4,535,468 A    8/1985  Kempter
5,187,601 A  * 2/1993  Yamazaki et al. .......... 349/187
6,602,790 B2 * 8/2003  Kian et al. .................. 438/690

FOREIGN PATENT DOCUMENTS

| EP | 1 041 400 A2 | 4/2000 | |
| JP | 356117470 A  * | 9/1981 | ............ H04N/1/00 |
| JP | 361231754 A  * | 10/1986 | ........... H01L/27/14 |
| JP | 409061834 A  * | 3/1997 | ......... G02F/1/1343 |
| JP | 2000-284056 | 10/2000 | |

* cited by examiner

Primary Examiner—Constantine Hannaher
Assistant Examiner—Otilia Gabor
(74) Attorney, Agent, or Firm—Sughrue Mion, PLLC

(57) ABSTRACT

In a process for producing an alternate striped electrode array in which transparent electrodes alternate with opaque electrodes: the opaque electrodes are formed on a transparent base; a continuous, transparent conductive film is formed on the opaque electrodes and the transparent base; a continuous, negative resist film is formed on the transparent conductive film; a resist pattern corresponding to the opaque electrodes is formed by using the opaque electrodes as a mask and applying a predetermined type of electromagnetic radiation from the back surface of the transparent base to the negative resist film; and the transparent conductive film is etched by using the resist pattern as a mask so that a portion of the transparent conductive film which remains after the etching is separated from the opaque electrodes and forms the transparent electrodes.

6 Claims, 10 Drawing Sheets

EXPOSURE

DEVELOP & RINSE

ETCH

REMOVE RESIST

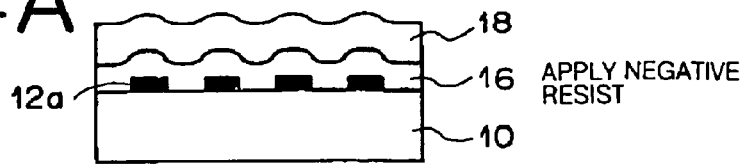
FIG.4A — APPLY NEGATIVE RESIST
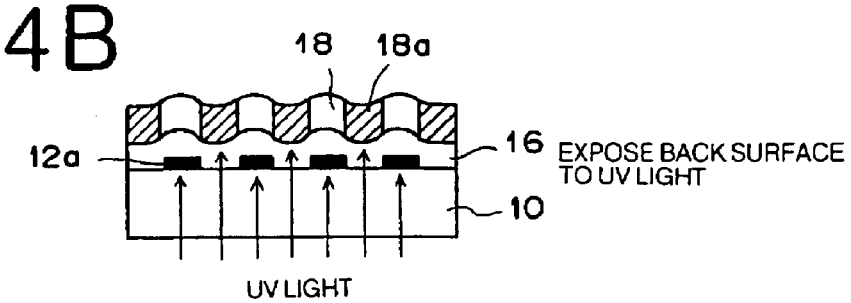
FIG.4B — EXPOSE BACK SURFACE TO UV LIGHT
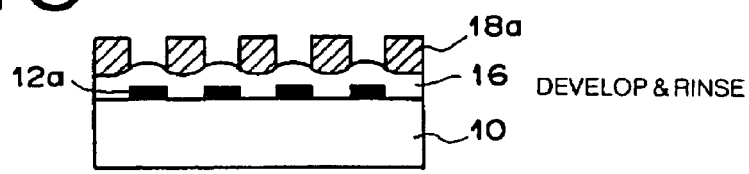
FIG.4C — DEVELOP & RINSE
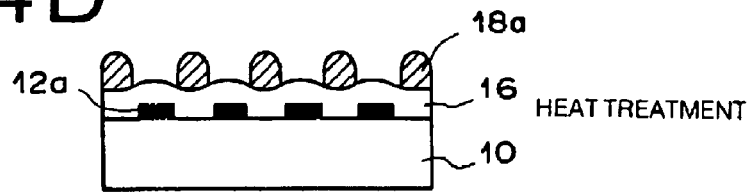
FIG.4D — HEAT TREATMENT
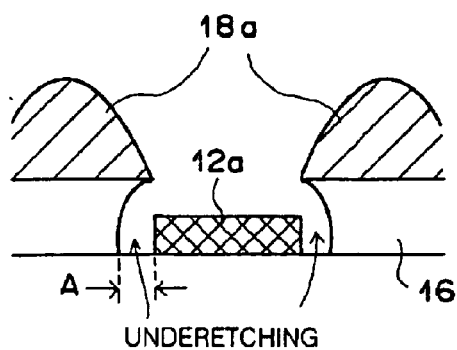
FIG.5 — UNDERETCHING

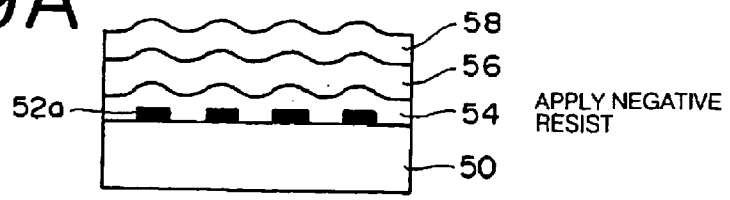
FIG. 9A — APPLY NEGATIVE RESIST
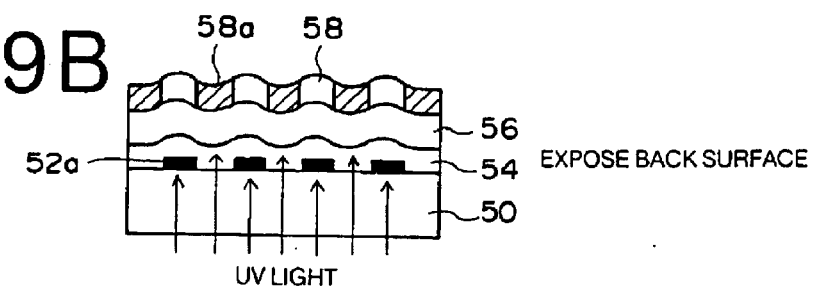
FIG. 9B — EXPOSE BACK SURFACE
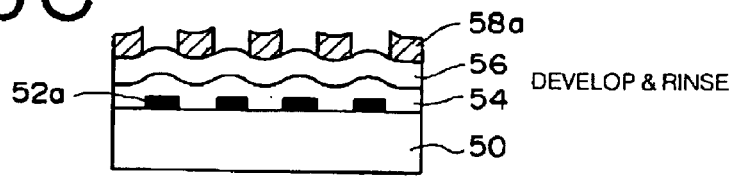
FIG. 9C — DEVELOP & RINSE
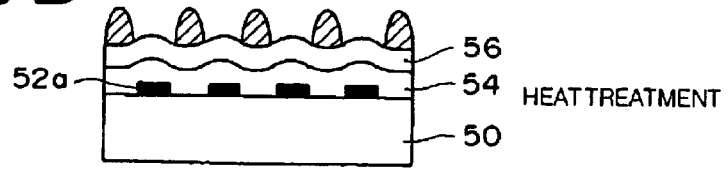
FIG. 9D — HEAT TREATMENT
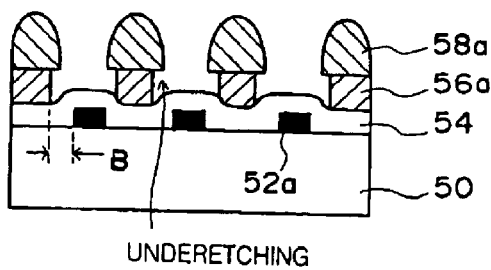
FIG. 10 — UNDERETCHING

APPLY NEGATIVE RESIST

EXPOSE

DEVELOP & RINSE

HEAT TREATMENT

PROCESS FOR PRODUCING ALTERNATE STRIPED ELECTRODE ARRAY IN WHICH TRANSPARENT ELECTRODES ALTERNATE WITH OPAQUE ELECTRODES, BASED ON SINGLE MASK DESIGNED FOR THE OPAQUE ELECTRODES IN SELF-ALIGNED MANNER

CROSS-REFERENCE TO RELATED APPLICATIONS

The subject matters disclosed in this specification are related to the subject matters disclosed in the copending, commonly-assigned U.S. patent application, U.S. Ser. No. 09/539,412 filed by Masaharu Ogawa, Shinji Imai (the inventor of the present invention), and Toshitaka Agano on Mar. 30, 2000 and entitled "RADIATION SOLID-STATE DETECTORS, AND RADIATION IMAGE RECORD-READING METHOD AND DEVICE USING THE SAME," corresponding to Japanese patent application No. 11(1999)-87922, which is disclosed in Japanese Unexamined Patent Publication No. 2000-284056. The contents of this U.S. patent application and the corresponding Japanese patent application are incorporated in this specification by reference.

BACKGROUND OF THE INVENTION

1. Field of the Invention

The present invention relates to an alternate striped electrode array comprising first and second striped electrode arrays, where the first striped electrode array includes a plurality of first linear electrodes, the second striped electrode array includes a plurality of second linear electrodes alternating with the plurality of first linear electrodes, the plurality of first linear electrodes are transparent to a predetermined type of electromagnetic radiation, the plurality of second linear electrodes are opaque to the predetermined type of electromagnetic radiation, and the plurality of first linear electrodes and the plurality of second linear electrodes are arranged approximately parallel to each other. The present invention also relates to a process for producing the above alternate striped electrode array.

2. Description of the Related Art

In a conventionally known, radiographic-image recording method used in medical radiography and the like for reduction of patient exposure doses, improvement of diagnostic performance, and the like, a solid-state radiographic-image detector which functions as an electrostatic recording medium and includes a charge storage portion and a photoconductor (such as a selenium plate) sensitive to a radiation such as X rays is exposed to X rays carrying information on a radiographic image so that an amount of electric charges corresponding to an exposure dose of the X rays is stored in each area of the solid-state radiographic-image detector, i.e., the information on the radiographic image is recorded in the solid-state radiographic-image detector as a latent image. The information on the radiographic image recorded in the solid-state radiographic-image detector can be read by scanning the solid-state radiographic-image detector with a laser beam or a line-shaped light band. The above method is disclosed in the U.S. Pat. No. 4,535,468 and other publications.

The Japanese Unexamined Patent Publication No. 2000-284056 discloses a solid-state radiographic-image detector which concurrently realizes quick response and efficient readout of signal charges in the reading operation. The solid-state radiographic-image detector is constructed by forming a first electrode layer, a recording-side photoconductive layer, a charge storage portion, a reading-side photoconductive layer, and a second electrode layer in this order. The first electrode layer is transparent to recording light, which is a radiation or light emitted from excited states caused by a radiation. The recording-side photoconductive layer exhibits conductivity when the recording-side photoconductive layer is exposed to the recording light which has passed through the first electrode layer. Each area of the charge storage portion stores as latent-image charges an amount of electric charges corresponding to an exposure dose of the recording light in the area of the recording-side photoconductive layer corresponding to the area of the charge storage portion.

The reading-side photoconductive layer exhibits conductivity when the reading-side photoconductive layer is exposed to reading light. The reading-side photoconductive layer exhibits conductivity when the reading-side photoconductive layer is exposed to reading light. The second electrode layer comprises first and second striped electrode arrays, where the first striped electrode array includes a plurality of first linear electrodes, the second striped electrode array includes a plurality of second linear electrodes alternating with the plurality of first linear electrodes, the plurality of first linear electrodes are transparent to the reading light, the plurality of second linear electrodes are opaque to the reading light, and the plurality of first linear electrodes and the plurality of second linear electrodes are arranged approximately parallel to each other.

When the solid-state radiographic-image detector is irradiated with recording light which has passed through an object, the recording light enters the recording-side photoconductive layer through the first electrode layer, and generates first pairs of opposite (positive and negative) charges in each area of the recording-side photoconductive layer, where the amount of the first pairs of opposite charges generated in each area of the recording-side photoconductive layer corresponds to an exposure dose of the recording light in the area of the recording-side photoconductive layer. In the situation in which a negative voltage is applied to the first electrode layer and a positive voltage is applied to the second electrode layer, the negative charges generated in each area of the recording-side photoconductive layer is stored in the corresponding area of the charge storage portion as latent-image charges. Thus, a radiographic image of the object is recorded in the solid-state radiographic-image detector as a latent image. In particular, in the case where the first and second striped electrode arrays are connected at the time of the recording, the latent-image charges stored in each area of the charge storage portion are collected in the positions corresponding to the linear electrodes of the first and second striped electrode arrays.

Thereafter, when the reading-side electrode layer is scanned with the reading light, the reading light enters the reading-side electrode layer through the plurality of first linear electrodes constituting the second electrode layer, and generates second pairs of opposite charges in the reading-side photoconductive layer, and positive charges out of the second pairs of opposite charges are combined with the latent-image charges stored in the charge storage portion. On the other hand, negative charges out of the second pairs of opposite charges are combined with positive charges held in the first and second striped electrode arrays, so that the latent-image charges can be read out from the solid-state radiographic-image detector.

That is, in the solid-state radiographic-image detector disclosed in the Japanese Unexamined Patent Publication No. 2000-284056, transport charge having the opposite polarity to that of the latent-image charges can be held in the second striped electrode array as well as the first striped electrode array. Therefore, the amount of signal charges which can be read out from the solid-state radiographic-image detector can be increased, and thus the reading efficiency can be improved.

In order to produce the above solid-state radiographic-image detector disclosed in the Japanese Unexamined Patent Publication No. 2000-284056, it is necessary to produce an alternate striped electrode array comprising first and second striped electrode arrays which are made of different materials in such a manner that the linear electrodes constituting the first striped electrode array and the linear electrodes constituting the second striped electrode array are arranged alternately and approximately parallel to each other. An easily conceivable technique used for producing the above alternate striped electrode array is photolithography. In this case, the alternate striped electrode array can be produced by using at least two masks respectively provided for the first and second striped electrode arrays.

However, the size of the above solid-state radiographic-image detector is as large as 43 cm×43 cm. Therefore, in order to produce the alternate striped electrode array of the solid-state radiographic-image detector by photolithography, a large-sized exposure system which can realize high-precision mask alignment in a large area is required. In addition, in the case where more than one solid-state radiographic-image detector is concurrently manufactured by using a single exposure system for cost reduction, a larger-size exposure system is required. If only one solid-state radiographic-image detector is concurrently manufactured, the yield rate decreases, and the manufacturing cost and variations in the characteristics of the solid-state radiographic-image detectors increase.

Further, in the operation of reading the latent-image charges from the solid-state radiographic-image detector, one of the first and second striped electrode arrays is maintained at a reference potential, and the other of the first and second striped electrode arrays is connected to a current detection amplifier or the like. However, if there are variations in the (reference) potentials of the linear electrodes constituting the one of the first and second striped electrode arrays, the electric signals representing the latent-image charges read out from the solid-state radiographic-image detector are affected by the variations.

In order to eliminate the above variations in the reference potentials of the linear electrodes constituting one of the first and second striped electrode arrays, the one of the first and second striped electrode arrays can be formed as a common electrode. However, in this case, a further manufacturing process is required for connecting the linear electrodes constituting the one of the first and second striped electrode arrays.

SUMMARY OF THE INVENTION

An object of the present invention is to provide a process for producing an alternate striped electrode array in a self-aligned manner (without mask alignment) using only one mask designed for a single striped electrode array, without using a large-sized exposure system which can realize high-precision mask alignment in a large area, so as to enable multiple production (concurrent production of a plurality of alternate striped electrode arrays), yield rate improvement, and cost reduction.

Another object of the present invention is to provide an alternate striped electrode array which comprises first and second striped electrode arrays, and does not cause variations in electric potentials of linear electrodes constituting one of the first and second striped electrode arrays.

(I) According to the first aspect of the present invention, there is provided a process for producing an alternate striped electrode array which comprises first and second striped electrode arrays formed on a base transparent to a predetermined type of electromagnetic radiation, where the first striped electrode array includes a plurality of first linear electrodes, the second striped electrode array includes a plurality of second linear electrodes alternating with the plurality of first linear electrodes, the plurality of first linear electrodes are transparent to the predetermined type of electromagnetic radiation, the plurality of second linear electrodes are opaque to the predetermined type of electromagnetic radiation, and the plurality of first linear electrodes and the plurality of second linear electrodes are arranged approximately parallel to each other. The process comprises the steps of: (a) forming the second striped electrode array on an upper surface of the base; (b) forming a continuous, transparent conductive film on an upper surface of the base and an upper surface of the second striped electrode array; (c) forming a continuous resist film on an upper surface of the transparent conductive film, where the continuous resist film is negative with respect to the predetermined type of electromagnetic radiation; (d) forming a resist pattern corresponding to the second striped electrode array by applying the predetermined type of electromagnetic radiation through a lower surface of the base to the continuous resist film other than portions of the continuous resist film which are masked by the second striped electrode array; and (e) etching the transparent conductive film by using the resist pattern as a mask so that a portion of the transparent conductive film which remains after etching is separated from the second striped electrode array and forms the first striped electrode array.

In the steps (b) and (c), the meaning of the word "continuous" is that the transparent conductive film and the resist film include substantially no discontinuity or crevice. The surfaces of the transparent conductive film and the resist film are not necessarily flat, and the thicknesses of the transparent conductive film and the resist film are not necessarily uniform.

In addition, the transparent conductive film is formed on a partial or entire upper surface of the structure formed in the step (a). For example, the transparent conductive film may be formed on the upper surface of the structure formed in the step (a) other than the area including contacts of the plurality of second linear electrodes.

In the step (e), the etching is performed so that the first striped electrode array constituted by the portion of the transparent conductive film which remains after the etching is physically separated and electrically insulated from the second striped electrode array.

When the process according to the first aspect of the present invention is used, an alternate striped electrode array can be produced in a self-aligned manner (without mask alignment) using only one mask designed for a single striped electrode array, without using a large-sized exposure system which can realize high-precision mask alignment in a large area.

In addition, multiple production (concurrent production of a plurality of alternate striped electrode arrays) becomes possible, so that the yield rate can be improved and the manufacturing cost can be reduced.

Further, in the process according to the first aspect of the present invention, the first striped electrode array can be formed as a common electrode in which the plurality of first linear electrodes are connected at their ends on one side, without a specific manufacturing step for connecting the plurality of first linear electrodes. That is, the manufacturing cost can also be reduced in this sense.

(II) According to the second aspect of the present invention, there is provided a process for producing an alternate striped electrode array which comprises first and second striped electrode arrays formed on a base transparent to a predetermined type of electromagnetic radiation, where the first striped electrode array includes a plurality of first linear electrodes, the second striped electrode array includes a plurality of second linear electrodes alternating with the plurality of first linear electrodes, the plurality of first linear electrodes are transparent to the predetermined type of electromagnetic radiation, the plurality of second linear electrodes are opaque to the predetermined type of electromagnetic radiation, and the plurality of first linear electrodes and the plurality of second linear electrodes are arranged approximately parallel to each other. The process comprises the steps of: (a) forming the second striped electrode array on an upper surface of the base; (b) forming a continuous, transparent insulation film on an upper surface of the base and an upper surface of the second striped electrode array; (c) forming a continuous, transparent conductive film on an upper surface of the transparent insulation film; (d) forming a continuous resist film on an upper surface of the transparent conductive film, where the continuous resist film is negative with respect to the predetermined type of electromagnetic radiation; (e) forming a resist pattern corresponding to the second striped electrode array by applying the predetermined type of electromagnetic radiation through a lower surface of the base to the continuous resist film other than portions of the continuous resist film which are masked by the second striped electrode array; and (f) etching the transparent conductive film by using the resist pattern as a mask so that a portion of the transparent conductive film which remains after etching forms the first striped electrode array.

In the steps (b), (c), and (d), the meaning of the word "continuous" is that the transparent insulation film, the transparent conductive film, and the resist film include substantially no discontinuity or crevice. The surfaces of the transparent insulation film, the transparent conductive film, and the resist film are not necessarily flat, and the thicknesses of the transparent insulation film, the transparent conductive film, and the resist film are not necessarily uniform.

In addition, the transparent insulation film is formed on a partial or entire upper surface of the structure formed in the step (a). For example, the transparent insulation film may be formed on the upper surface of the structure formed in the step (a) other than the area including contacts of the plurality of second linear electrodes.

Further, the transparent conductive film is formed on a partial or entire upper surface of the structure formed in the step (b).

The transparent insulation film is transparent to the above predetermined type of electromagnetic radiation, and provided for electrically insulating the second striped electrode array and the first striped electrode array made of the transparent conductive film, from each other.

It is preferable to perform heat treatment for realizing thermal contraction of the resist pattern in the structure formed in the step (e), before performing the operation in step (f). When the heat treatment is performed, it is possible to efficiently realize underetching, which is explained later.

The process according to the second aspect of the present invention has the same advantages as the process according to the first aspect of the present invention. In addition, it is possible to further improve the insulation performance.

(III) According to the third aspect of the present invention, there is provided a process for producing an alternate striped electrode array which comprises first and second striped electrode arrays formed on a base transparent to a predetermined type of electromagnetic radiation, where the first striped electrode array includes a plurality of first linear electrodes, the second striped electrode array includes a plurality of second linear electrodes alternating with the plurality of first linear electrodes, the plurality of first linear electrodes are transparent to the predetermined type of electromagnetic radiation, the plurality of second linear electrodes are opaque to the predetermined type of electromagnetic radiation, and the plurality of first linear electrodes and the plurality of second linear electrodes are arranged approximately parallel to each other. The process comprises the steps of: (a) forming a continuous, transparent conductive film on an upper surface of the base; (b) forming the second striped electrode array on an upper surface of the transparent conductive film; (c) forming a continuous resist film on an upper surface of the transparent conductive film and an upper surface of the second striped electrode array; (d) forming a resist pattern corresponding to the second striped electrode array by applying the predetermined type of electromagnetic radiation through a lower surface of the base to the continuous resist film other than portions of the continuous resist film which are masked by the second striped electrode array; (e) producing gaps between the resist pattern and the second striped electrode array so as to expose the transparent conductive film at bottoms of the gaps; and (f) etching the transparent conductive film by using the resist pattern and the second striped electrode array as a mask so that a portion of the transparent conductive film which remains after etching is separated from the second striped electrode array and forms the first striped electrode array.

In the steps (a) and (c), the meaning of the word "continuous" is that the transparent conductive film and the resist film include substantially no discontinuity or crevice. The surfaces of the transparent conductive film and the resist film are not necessarily flat, and the thicknesses of the transparent conductive film and the resist film are not necessarily uniform.

In addition, the transparent conductive film is formed on a partial or entire upper surface of the structure formed in the step (b). For example, the transparent conductive film may be formed on the upper surface of the structure formed in the step (b) other than the area including contacts of the plurality of second linear electrodes.

The operation in step (e) may be any operation which can produce gaps between the resist pattern and the second striped electrode array and expose the transparent conductive film at bottoms of the gaps so as to enable etching of the transparent conductive film. For example, the operation in step (e) may be realized by the aforementioned heat treatment.

In the step (f), the etching is performed so that the first striped electrode array constituted by the portion of the transparent conductive film which remains after the etching is physically separated and electrically insulated from the second striped electrode array.

The process according to the third aspect of the present invention has the same advantages as the process according to the first aspect of the present invention.

(IV) The following features are common to the processes according to the first to third aspects of the present invention.

(i) The predetermined type of electromagnetic radiation is an electromagnetic radiation which can transmit through the transparent conductive film and to which the resist film is sensitive.

(ii) The transparent conductive film is not necessarily 100% transparent to the predetermined type of electromagnetic radiation. It is sufficient that the transparent conductive film is transparent to the predetermined type of electromagnetic radiation to such a degree that the resist film can be substantially exposed to the predetermined type of electromagnetic radiation which has passed through the transparent conductive film.

In addition, it is not necessary that the second striped electrode array completely stops the predetermined type of electromagnetic radiation. It is sufficient that the second striped electrode array stops the predetermined type of electromagnetic radiation to such a degree that substantially the resist film cannot be exposed to the predetermined type of electromagnetic radiation which has passed through the second striped electrode array.

(iii) The transparent conductive film is a film of which the first striped electrode array is formed, and is made of a material which is transparent to the predetermined type of electromagnetic radiation and so conductive that the material can be used for forming the first striped electrode array.

(iv) The etching may be such a type that underetching occurs. The underetching is a phenomenon in which etching proceeds in the horizontal direction as well as the vertical direction. For example, in the case of FIG. 5, etching proceeds from the edges of the resist pattern 18a in the horizontal direction as well as the vertical direction. Therefore, the portions of the transparent conductive film 16 located under the resist pattern 18a are removed by underetching. As a result of the underetching, each linear electrode 12a constituting the second striped electrode array is separated from the remaining portions of the transparent conductive film 16.

(v) Preferably, the transparent conductive film is made of a completely amorphous material.

If the transparent conductive film is made of a microcrystal material such as the conventional ITO films, the etching rate is likely to vary depending on the location in the transparent conductive film. Therefore, a short circuit may be formed where the etching rate is insufficient, and the first and second striped electrode arrays may be disconnected where the etching rate is excessively high. That is, when the transparent conductive film is made of a microcrystal material, it is not easy to construct an alternate striped electrode array having a large area and uniform characteristics in the large area.

The completely amorphous material is a material having a substantially complete amorphous structure. For example, the IZO (indium-doped zinc oxide) such as IDIXO (Idemitsu Indium X-metal Oxide) and the completely amorphous ITO produced by precisely adding $H_2O$ to sputtering gas are known as a completely amorphous material, where IDIXO is a kind of the IZO which is completely amorphous and manufactured by Idemitsu Kosan Co., Ltd. Alternatively, any other material having a completely amorphous structure can be used for forming the transparent conductive film.

In the case where the transparent conductive film is made of a completely amorphous material such as IDIXO, underetching can proceed at a uniform etching rate at every location in the transparent conductive film. In this case, deep underetching becomes possible. For example, the first striped electrode array can be separated from the second striped electrode array with a distance of 10 micrometers by underetching. In addition, since the edges of the first striped electrode array are smoothed, charge injection from the edges of the first striped electrode array can be reduced.

Further, it is possible to produce a completely amorphous ITO film by precisely adding $H_2O$ to sputtering gas. When the transparent conductive film is made of a completely amorphous ITO film, it is possible to make the first striped electrode array alkali resistant.

(vi) In the case where the underetching is used for separating the first and second striped electrode arrays from each other, it is necessary that the gaps formed between the first and second striped electrode arrays are sufficient to prevent formation of a short circuit between the first and second striped electrode arrays and occurrence of a harmful phenomenon such as noise production caused by interaction between the first and second striped electrode arrays. On the other hand, when the underetching proceeds too much, a small flaw in the transparent conductive film can be extended to such a degree that a defect (e.g., a disconnection in the first and second striped electrode arrays) is produced.

Specifically, it is preferable that the gaps between the first and second striped electrode arrays are within the range from 1 to 7 micrometers. More preferably, the gaps are within the range from 2 to 5 micrometers. When the gaps are within the above ranges, it is possible to prevent formation of a short circuit between the first and second striped electrode arrays, occurrence of a harmful phenomenon (such as noise production) caused by interaction between the first and second striped electrode arrays, and production of a harmful defect (such as a disconnection) caused by excessive underetching.

(V) According to the fourth aspect of the present invention, there is provided an alternate striped electrode array comprising: a base which is transparent to a predetermined type of electromagnetic radiation; a first striped electrode array being formed above the base and including a plurality of first linear electrodes which are transparent to the predetermined type of electromagnetic radiation; and a second striped electrode array being formed above the base and including a plurality of second linear electrodes which are opaque to the predetermined type of electromagnetic radiation and alternate with said plurality of first linear electrodes. The plurality of first linear electrodes and the plurality of second linear electrodes are arranged approximately parallel to each other, and the plurality of first linear electrodes are connected at their ends on one side so as to form a common electrode.

DESCRIPTION OF THE DRAWINGS

FIGS. 4A to 4D are cross-sectional views of structures formed in respective steps in the third stage of the process as the first embodiment of the present invention.

FIG. 5 is a cross-sectional view of a portion of the alternate striped electrode array produced by the process as the first embodiment of the present invention.

FIGS. 9A to 9D are cross-sectional views of structures formed in respective steps in the fourth stage of the process as the second embodiment of the present invention.

FIG. 10 is a cross-sectional view of a portion of the alternate striped electrode array produced by the process as the second embodiment of the present invention.

DESCRIPTION OF PREFERRED EMBODIMENTS

Embodiments of the present invention are explained in detail below with reference to drawings.

First Embodiment

Figure 6:
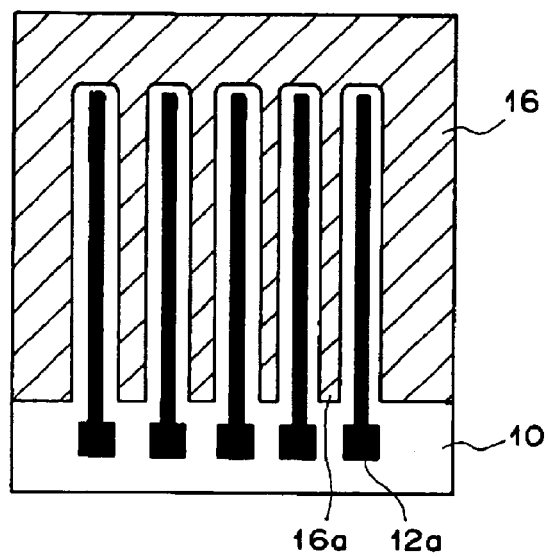
FIG. 6 is a plan view of the alternate striped electrode array produced by the process as the first embodiment of the present invention.

A process for producing an alternate striped electrode array as the first embodiment of the present invention is explained below with reference to FIGS. 1A to 1F, 2, 3A, 3B, 4A to 4D, and 5, which are provided for explaining the process for producing an alternate striped electrode array as the first embodiment of the present invention. In addition, FIG. 6 is a plan view of the alternate striped electrode array produced by the process as the first embodiment of the present invention. As illustrated in FIG. 6, the alternate striped electrode array produced by the process as the first embodiment of the present invention comprises first and second striped electrode arrays formed on a glass substrate 10.

In the first stage of the process as the first embodiment of the present invention, the second striped electrode array is formed on the glass substrate 10 by conventional photolithography, where the second striped electrode array comprises a plurality of linear electrodes 12a. Details of the first stage of the process as the first embodiment of the present invention are explained below with reference to FIGS. 1A to 1F, and 2.

Figure 1A:
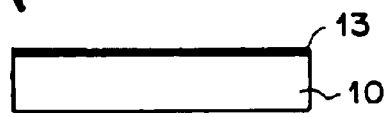
FIGS. 1A to 1F are cross-sectional views of structures formed in respective steps in the first stage of a process for producing an alternate striped electrode array as a first embodiment of the present invention.
Figure 1B:
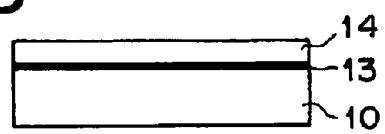
Figure 1C:
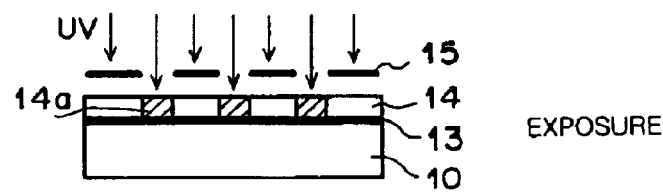
Figure 1D:
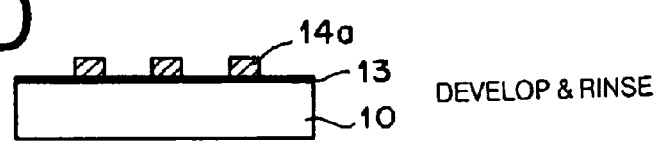
Figure 1E:
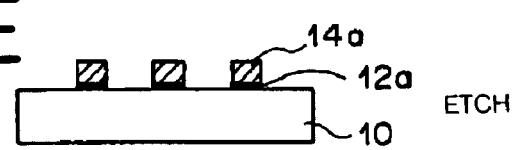
Figure 1F:
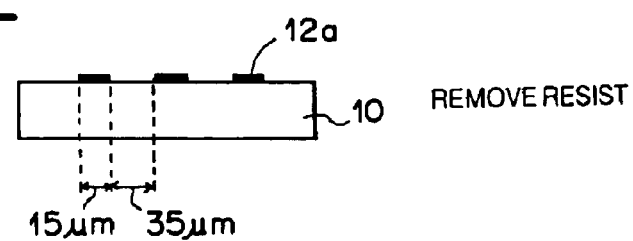

First, a Cr film 13 having a thickness of about 0.1 micrometers is formed on an upper surface of the glass substrate 10 by vacuum evaporation, as illustrated in FIG. 1A. Then, a resist 14 is applied on the entire surface of the Cr film 13, as illustrated in FIG. 1B, and the resist 14 is exposed to ultraviolet light by using a mask 15 which is patterned corresponding to desired arrangement and shape of the second striped electrode array, as illustrated in FIG. 1C. Thereafter, the resist 14 is developed and rinsed, so that a resist pattern 14a corresponding to the second striped electrode array is formed on the upper surface of the Cr film 13, as illustrated in FIG. 1D. Next, the Cr film 13 is etched by using the resist pattern 14a as a mask, as illustrated in FIG. 1E, and then the resist pattern 14a is removed. Thus, the second striped electrode array comprising the plurality of linear electrodes 12a is formed on the upper surface of the glass substrate 10, as illustrated in FIG. 1F.

Figure 2:
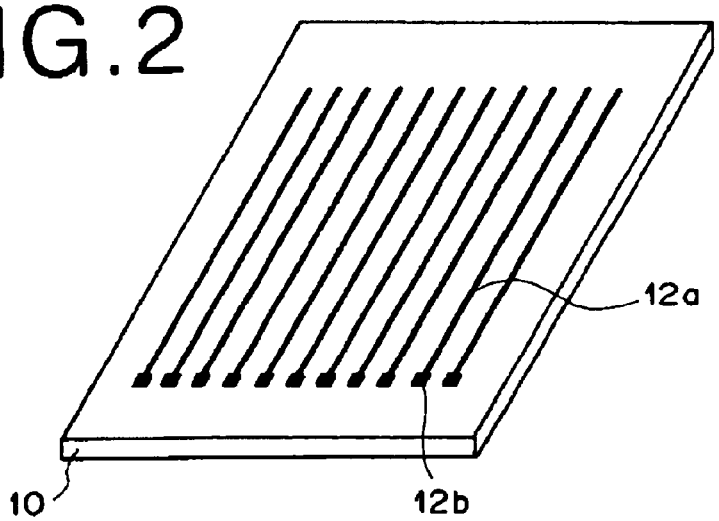
FIG. 2 is a perspective view of the structure formed in the first stage of the process as the first embodiment of the present invention.

It is preferable that the width of each of the plurality of linear electrodes 12a is about 15 micrometers, and the gap between each pair of adjacent ones of the linear electrodes 12a is about 35 micrometers. In addition, as illustrated in FIG. 2, the plurality of linear electrodes 12a are separately formed, and have contacts 12b at their ends on one side.

Figure 3A:
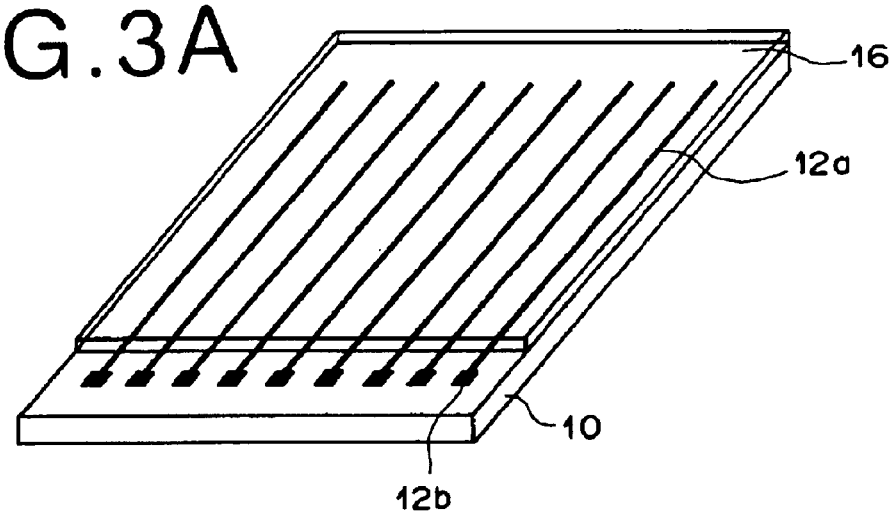
FIG. 3A is a perspective view of the structure formed in the second stage of the process as the first embodiment of the present invention.
Figure 3B:
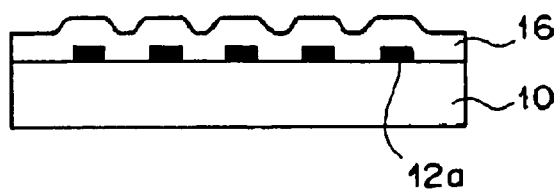
FIG. 3B is a cross-sectional view of the structure formed in the second stage of the process as the first embodiment of the present invention.

In the second stage of the process as the first embodiment of the present invention, a transparent conductive film 16, e.g., an indium tin oxide (ITO) film, is uniformly formed over the glass substrate 10 and the second striped electrode array so that the contacts 12b of the linear electrodes 12a are exposed as illustrated in FIG. 3A. FIG. 3B shows a cross section of a portion of the layered structure of FIG. 3A in which the transparent conductive film 16 is formed over the glass substrate 10 and the second striped electrode array. The transparent conductive film 16 can be formed by vacuum evaporation or dip coating. In the case where the transparent conductive film 16 is formed by vacuum evaporation such as electron-beam (EB) evaporation or resistance-heating evaporation, the contacts 12b can be exposed by using an evaporation mask which masks the area including the contacts 12b. Alternatively, after a transparent conductive film is formed over the entire area of the glass substrate 10 and the second striped electrode array, a portion of the transparent conductive film on the area including the contacts 12b can be removed by etching.

In the third stage of the process as the first embodiment of the present invention, a negative resist 18 is uniformly applied on the upper surface of the transparent conductive film 16, as illustrated in FIG. 4A, and then the negative resist 18 is exposed to ultraviolet light which is applied to the negative resist 18 from the lower surface of the glass substrate 10 through the glass substrate 10 and the transparent conductive film 16, as illustrated in FIG. 4B. At this time, portions of the negative resist 18 which are masked by the second striped electrode array are not exposed to the ultraviolet light. Next, the negative resist 18 is developed and rinsed, so that a resist pattern 18a corresponding to the arrangement and shape of the second striped electrode array is formed as illustrated in FIG. 4C. Thereafter, heat treatment is performed on the layered structure of FIG. 4C. As a result of the heat treatment, the resist pattern 18a shrinks so that the portions of the resist pattern 18a located above the gaps between the plurality of linear electrodes 12a each have an arc-shaped cross section as illustrated in FIG. 4D. The above heat treatment is performed for promoting underetching, which is explained later.

In the fourth stage of the process as the first embodiment of the present invention, the transparent conductive film 16 in the layered structure of FIG. 4D is etched until each of the plurality of linear electrodes 12a is separated from the transparent conductive film 16. At this time, the separation of the plurality of linear electrodes 12a from the transparent conductive film 16 is realized by underetching. That is, etching proceeds in the horizontal direction as well as the vertical direction so that portions of transparent conductive film 16 located under of the resist pattern 18a are partially etched off as illustrated in FIG. 5. The underetching is a phenomenon which manifests itself when fine processing is required in manufacturing integrated circuits, and is considered to be undesirable for manufacturing integrated circuits since the underetching causes deterioration in dimensional precision. However, in the first embodiment of the present invention, the underetching is positively utilized for separating the plurality of linear electrodes 12a from the transparent conductive film 16.

In the fifth stage of the process as the first embodiment of the present invention, the resist pattern 18a is removed. Thus, an alternate striped electrode array comprising the first and second striped electrode arrays is formed in a self-aligned manner, where the linear electrodes 16a constituting the first striped electrode array and the linear electrodes 12a constituting the second striped electrode array are arranged alternately and approximately parallel to each other. As illustrated in FIG. 6, the plurality of linear electrodes 16a constituting the first striped electrode array are connected at their ends on one side so that the first striped electrode array becomes a common electrode.

As explained above, according to the process as the first embodiment of the present invention: (1) the second striped electrode array is formed on the upper surface of the glass substrate 10; (2) the transparent conductive film 16 is uniformly formed on the substrate 10 and the second striped electrode array; (3) the resist film 18 which behaves as a negative resist with respect to a predetermined type of electromagnetic radiation is uniformly formed on the upper surface of the transparent conductive film 16; (4) the resist film 18 is exposed to the predetermined type of electromagnetic radiation which is applied to the resist film 18 from the lower surface of the substrate 10 so as to form the resist pattern 18a corresponding to the second striped electrode array; and (5) the transparent conductive film 16 is etched by using the resist pattern 18a as a mask so as to form the first striped electrode array separated from the second striped electrode array.

Since the second striped electrode array is opaque to the predetermined type of electromagnetic radiation, the portions of the resist film 18 located behind (on) the second striped electrode array are not exposed to the predetermined type of electromagnetic radiation, and the other portions of the resist film 18 located above the gaps between the linear electrodes constituting the second striped electrode array are exposed to the predetermined type of electromagnetic radiation. Therefore, the resist pattern 18a corresponding to the second striped electrode array can be formed by the above exposure, and thus the first striped electrode array separated from the second striped electrode array can be formed by using the resist pattern 18a as a mask and etching the transparent conductive film 16.

That is, in the process as the first embodiment of the present invention, the large-sized exposure system which realizes high-precision mask alignment is unnecessary, and an alternate striped electrode array which does not cause a short circuit can be accurately manufactured in a self-aligned manner (without mask alignment) based on a mask designed for a single striped electrode array. In addition, the process as the first embodiment of the present invention enables multiple production (i.e., concurrent production of a plurality of alternate striped electrode arrays). Therefore, it is possible to increase the yield rate and decrease the manufacturing cost.

Second Embodiment

A process for producing an alternate striped electrode array as the second embodiment of the present invention is explained below with reference to FIGS. 7A, 7B, 8A, 8B, 9A to 9D, and 10, which are provided for explaining the process for producing an alternate striped electrode array as the second embodiment of the present invention.

Figure 11:
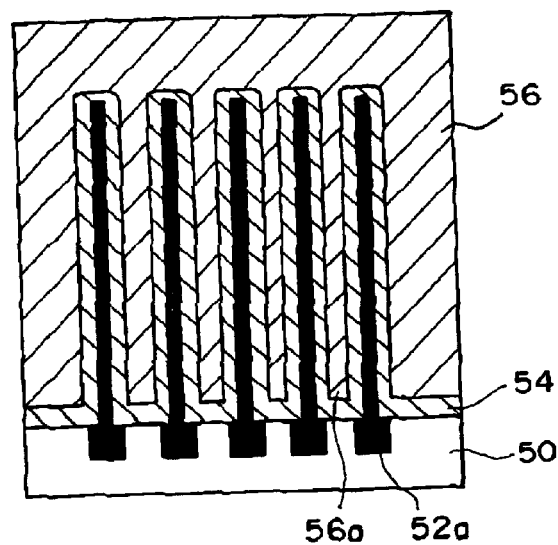
FIG. 11 is a plan view of the alternate striped electrode array produced by the process as the second embodiment of the present invention.

In addition, FIG. 11 is a plan view of the alternate striped electrode array produced by the process as the second embodiment of the present invention. As illustrated in FIG. 11, the alternate striped electrode array produced by the process as the second embodiment of the present invention also comprises first and second striped electrode arrays formed on a glass substrate 50.

In the following explanation, details of processing which are similar to the first embodiment are not repeated.

In the first stage of the process as the second embodiment of the present invention, the second striped electrode array is formed on the glass substrate 50 in a similar manner to the processing explained with reference to FIGS. 1A to 1F, where the second striped electrode array comprises a plurality of linear electrodes 52a.

It is preferable that the width of each of the plurality of linear electrodes 52a is about 15 micrometers, and the gap between each pair of adjacent ones of the linear electrodes 52a is about 35 micrometers. In addition, as illustrated in FIG. 7A, the plurality of linear electrodes 52a are separately formed, and have contacts 52b at their ends on one side.

Figure 7A:
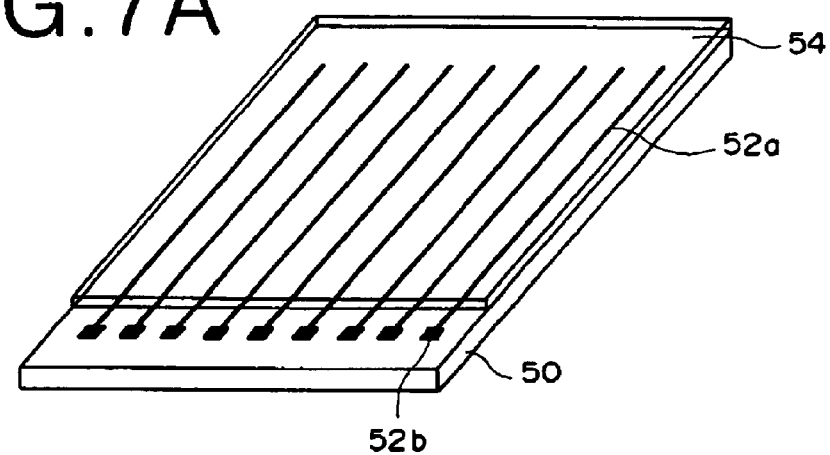
FIG. 7A a perspective view of the structure formed in the second stage of a process as a second embodiment of the present invention.
Figure 7B:
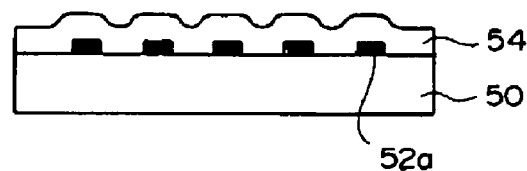
FIG. 7B is a cross-sectional view of the structure formed in the second stage of the process as the second embodiment of the present invention.

Next, in the second stage of the process as the second embodiment of the present invention, a transparent insulation film 54, e.g., an $SiO_2$ film, is uniformly formed over the glass substrate 50 and the second striped electrode array so that the contacts 52b of the linear electrodes 52a are exposed as illustrated in FIG. 7A. FIG. 7B shows a cross section of a portion of the layered structure of FIG. 7A in which the transparent insulation film 54 is formed over the glass substrate 50 and the second striped electrode array. The transparent insulation film 54 can be formed by vacuum evaporation or dip coating. In the case where the transparent insulation film 54 is formed by vacuum evaporation such as electron-beam (EB) evaporation or resistance-heating evaporation, the contacts 52b can be exposed by using an evaporation mask which masks the area including the contacts 52b. Alternatively, after a transparent insulation film is formed on the entire area of the glass substrate 50 and the second striped electrode array, a portion of the transparent insulation film on the area including the contacts 52b can be removed by etching.

Figure 8A:
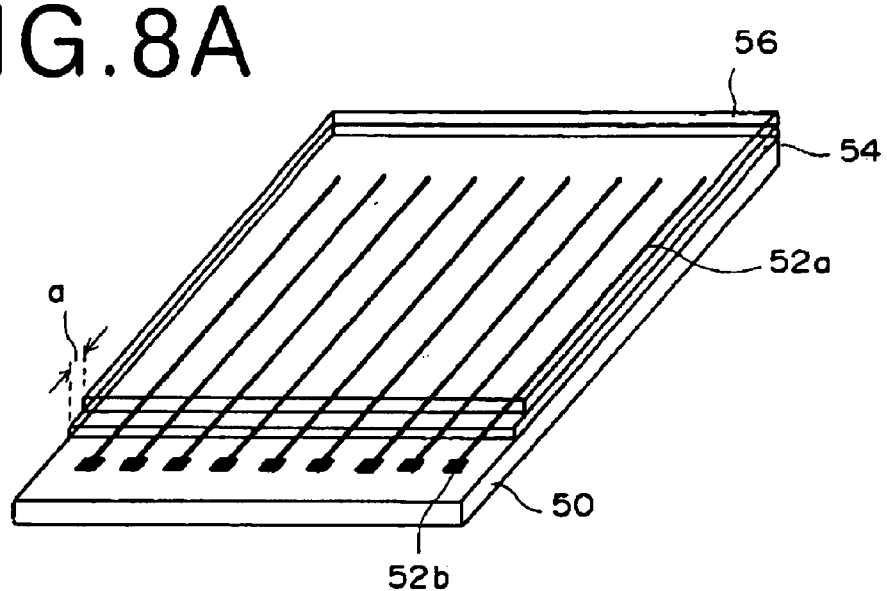
FIG. 8A is a perspective view of the structure formed in the third stage of the process as the second embodiment of the present invention.
Figure 8B:
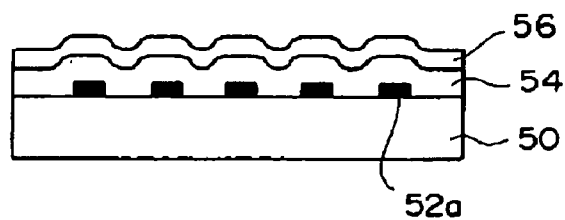
FIG. 8B is a cross-sectional view of the structure formed in the third stage of the process as the second embodiment of the present invention.

In the third stage of the process as the second embodiment of the present invention, a transparent conductive film 56 is uniformly formed on the transparent insulation film 54 other than a near-edge area of the transparent insulation film 54 having a width a, as illustrated in FIG. 8A. FIG. 8B shows a cross section of a portion of the layered structure in which the transparent conductive film 56 is formed on the transparent insulation film 54.

In the fourth stage of the process as the second embodiment of the present invention, a negative resist 58 is uniformly applied on the upper surface of the transparent conductive film 56, as illustrated in FIG. 9A, and then the negative resist 58 is exposed to ultraviolet light which is applied to the negative resist 58 from the lower surface of the glass substrate 50 through the glass substrate 50, the transparent insulation film 54, and the transparent conductive film 56, as illustrated in FIG. 9B. At this time, portions of the negative resist 58 which are masked by the second striped electrode array are not exposed to the ultraviolet light. Next, the negative resist 58 is developed and rinsed, so that a resist pattern 58a corresponding to the arrangement and shape of the second striped electrode array is formed as illustrated in FIG. 9C. Thereafter, heat treatment is performed on the layered structure of FIG. 9C. As a result of the heat treatment, the resist pattern 58a shrinks so that the portions of the resist pattern 58a located above the gaps between the plurality of linear electrodes 52a each have an arc-shaped cross section as illustrated in FIG. 9D. The above heat treatment is performed for promoting underetching, which is explained later.

In the fifth stage of the process as the second embodiment of the present invention, the transparent conductive film 56 in the layered structure of FIG. 9D is etched until the transparent conductive film 56 is separated into the plurality of linear electrodes 56a in the vicinities of the plurality of linear electrodes 52a constituting the second striped electrode array, as illustrated in FIG. 10. At this time, the underetching is utilized for the separation into the plurality of linear electrodes 56a.

In the sixth stage of the process as the second embodiment of the present invention, the resist pattern 58a is removed. Thus, an alternate striped electrode array comprising the first and second striped electrode arrays is formed in a self-aligned manner. In the alternate striped electrode array, the linear electrodes 56a constituting the first striped electrode array and the linear electrodes 52a constituting the second striped electrode array are arranged alternately and approximately parallel to each other, and the linear electrodes 52a constituting the second striped electrode array are electrically insulated from the first striped electrode array with the transparent insulation film 54. As illustrated in FIG. 11, the plurality of linear electrodes 56a constituting the first striped electrode array are connected at their ends on one side so that the first striped electrode array forms a common electrode.

As explained above, according to the process as the second embodiment of the present invention: (1) the second striped electrode array is formed on the upper surface of the glass substrate 50; (2) the transparent insulation film 54 is uniformly formed over the substrate 50 and the second striped electrode array; (3) the transparent conductive film 56 is uniformly formed on the transparent insulation film 54; (4) the resist film 58 which behaves as a negative resist with respect to a predetermined type of electromagnetic radiation is uniformly formed on the upper surface of the transparent conductive film 56; (5) the resist film 58 is exposed to the predetermined type of electromagnetic radiation which is applied to the resist film 58 from the lower surface of the substrate 50 so as to form the resist pattern 58a corresponding to the second striped electrode array; and (6) the transparent conductive film 56 is etched by using the resist pattern 58a as a mask.

Since the second striped electrode array is opaque to the predetermined type of electromagnetic radiation, the portions of the resist film 58 located behind (above) the second striped electrode array are not exposed to the predetermined type of electromagnetic radiation, and the other portions of the resist film 58 located above the gaps between the linear electrodes 52a constituting the second striped electrode array are exposed to the predetermined type of electromagnetic radiation. Therefore, the resist pattern 58a corresponding to the second striped electrode array can be formed by the above exposure, and the first striped electrode array separated from the second striped electrode array can be formed by using the resist pattern 58a as a mask and etching the transparent conductive film 56.

Thus, the process as the second embodiment of the present invention has the same advantages as the first embodiment. In addition, it is possible to improve insulation between the first and second striped electrode arrays.

Third Embodiment

A process for producing an alternate striped electrode array as the third embodiment of the present invention is explained below with reference to FIGS. 12A, 12B, 13, 14, 15A to 15D, and 16, which are provided for explaining the process for producing an alternate striped electrode array as the third embodiment of the present invention. The alternate striped electrode array produced by the process as the third embodiment of the present invention also comprises first and second striped electrode arrays formed on a glass substrate 20. In the following explanation, details of processing which are similar to the first embodiment are not repeated.

Figure 12A:
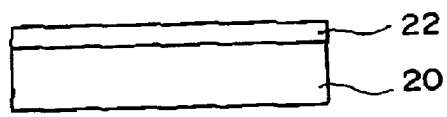
FIGS. 12A and 12B are cross-sectional views of structures formed in respective steps in the first stage of a process as a third embodiment of the present invention.
Figure 12B:
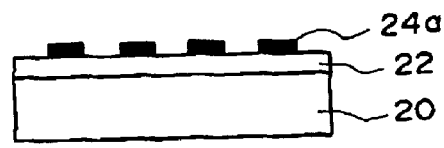

In the first stage of the process as the third embodiment of the present invention, a transparent conductive film 22, e.g., an indium tin oxide (ITO) film, is uniformly formed over the glass substrate 20, as illustrated in FIG. 12A. Then, the second striped electrode array is formed on the transparent conductive film 22 in a similar manner to the processing explained with reference to FIGS. 1A to 1F, where the second striped electrode array comprises a plurality of linear electrodes 24a, as illustrated in FIG. 12B.

It is preferable that the width of each of the plurality of linear electrodes 24a is about 15 micrometers, and the gap between each pair of adjacent ones of the linear electrodes 24a is about 35 micrometers. In addition, as illustrated in FIG. 13, the plurality of linear electrodes 24a are separately formed, and have contacts 24b at their ends on one side.

Figure 13:
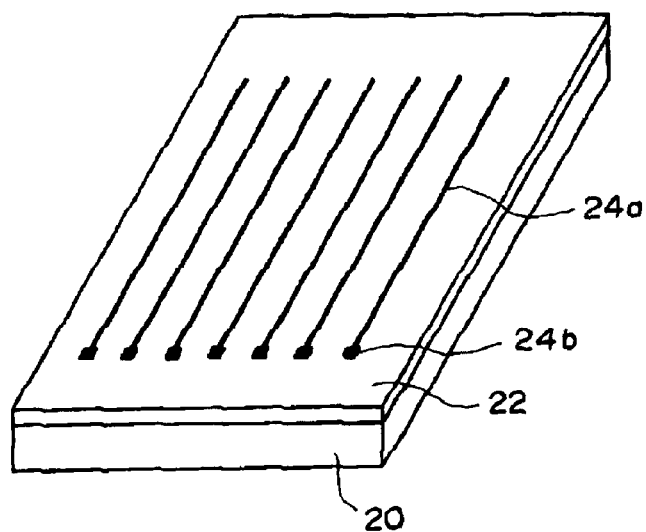
FIG. 13 is a perspective view of the structure formed in the first stage of the process as the third embodiment of the present invention.
Figure 14:
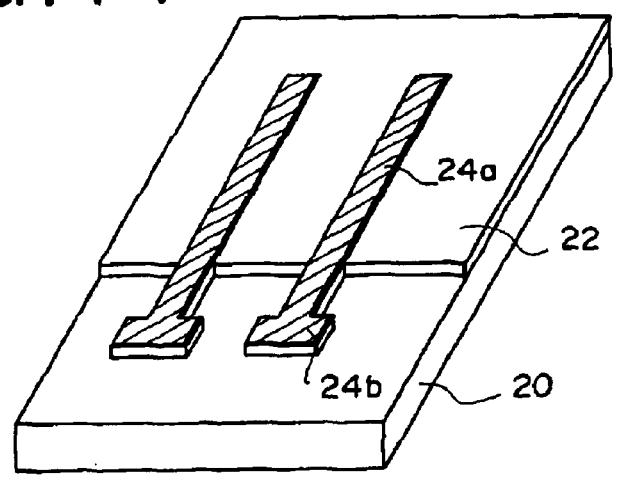
FIG. 14 is a perspective view of the structure formed in the second stage of the process as the third embodiment of the present invention.

Next, in the second stage of the process as the third embodiment of the present invention, the upper surface of the layered structure of FIG. 13 other than an area including the contacts 24b of the linear electrodes constituting the second striped electrode array is masked with a tape or the like, and then the transparent conductive film 22 in the area including the contacts 24b is etched by using the linear electrodes constituting the second striped electrode array as a mask so that the portions of the transparent conductive film 22 around the contacts 24b are removed as illustrated in FIG. 14. At this time, the etching is performed so that underetching does not occur.

Figure 15A:
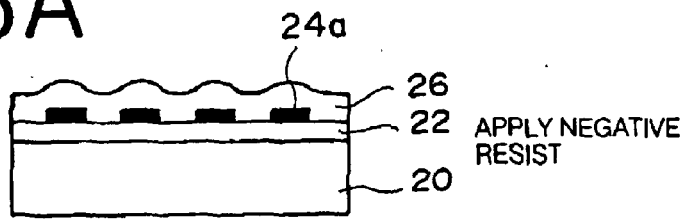
FIGS. 15A to 15D are cross-sectional views of structures formed in respective steps in the third stage of the process as the third embodiment of the present invention.
Figure 15B:
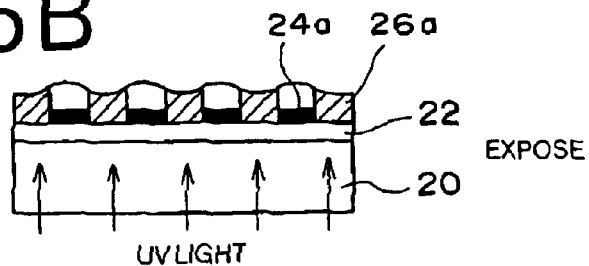

In the third stage of the process as the third embodiment of the present invention, a negative resist 26 is uniformly applied on the transparent conductive film 22 and the 24, as illustrated in FIG. 15A, and then the negative resist 26 is exposed to ultraviolet light which is applied to the negative resist 26 from the lower surface of the glass substrate 20 through the glass substrate 20 and the transparent conductive film 22, as illustrated in FIG. 15B. At this time, portions of the negative resist 26 which are masked by the second striped electrode array are not exposed to the ultraviolet light. Next, the negative resist 26 is developed and rinsed, so that a resist pattern 26a corresponding to the arrangement and shape of the second striped electrode array is formed as illustrated in FIG. 15C.

Figure 15C:
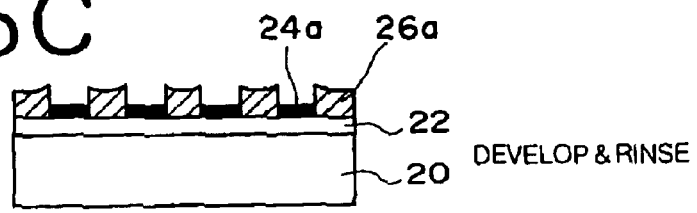
Figure 15D:
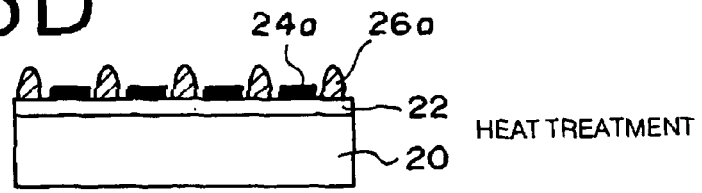

In the fourth stage of the process as the third embodiment of the present invention, heat treatment is performed on the layered structure of FIG. 15C. As a result of the heat treatment, the resist pattern 26a shrinks so that the portions of the resist pattern 26a located above the gaps between the plurality of linear electrodes 24a each have an arc-shaped cross section, gaps are produced between the plurality of linear electrodes 24a and the resist pattern 26a, and the transparent conductive film 22 is exposed at the bottoms of the gaps produced between the plurality of linear electrodes 24a and the resist pattern 26a, as illustrated in FIG. 15D. Thus, the transparent conductive film 22 can be etched from the bottoms of the gaps produced between the plurality of linear electrodes 24a and the resist pattern 26a.

Figure 16:
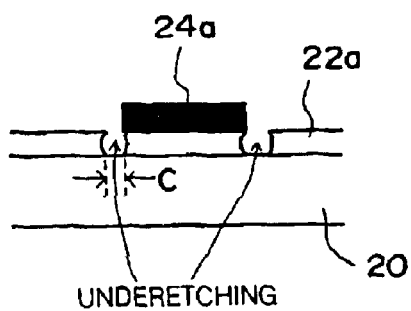
FIG. 16 is a cross-sectional view of a portion of the alternate striped electrode array produced by the process as the third embodiment of the present invention.

In the fifth stage of the process as the third embodiment of the present invention, the transparent conductive film 22 in the layered structure of FIG. 15D is etched until the plurality of linear electrodes 24a are separated from portions 22a of the transparent conductive film 22 which become the linear electrodes constituting the first striped electrode array, as illustrated in FIG. 16. At this time, the underetching is utilized for the separation of the plurality of linear electrodes 24a from the portions 22a of the transparent conductive film 22 which become the linear electrodes constituting the first striped electrode array.

In the sixth stage of the process as the third embodiment of the present invention, the resist pattern 26a is removed. Thus, an alternate striped electrode array comprising the first and second striped electrode arrays is formed in a self-aligned manner. In the alternate striped electrode array, the linear electrodes 22a constituting the first striped electrode array and the linear electrodes 24a constituting the second striped electrode array are arranged alternately and approximately parallel to each other. Although the alternate striped electrode array produced by the process as the third embodiment of the present invention has a cross section as illustrated in FIG. 16, the plan view of the alternate striped electrode array produced by the process as the third embodiment of the present invention is the same as the alternate striped electrode array produced by the process as the first embodiment of the present invention as illustrated in FIG. 6.

As explained above, according to the process as the third embodiment of the present invention: (1) the transparent conductive film 22 is uniformly formed on the upper surface of the glass substrate 20; (2) the second striped electrode array is formed on the transparent conductive film 22; (3) the resist film 26 which behaves as a negative resist with respect to a predetermined type of electromagnetic radiation is uniformly formed over the upper surfaces of the transparent conductive film 22 and the second striped electrode array; and (4) the resist film 26 is exposed to the predetermined type of electromagnetic radiation which is applied to the resist film 26 from the lower surface of the substrate 20 so as to form the resist pattern 26a corresponding to the second striped electrode array.

Since the second striped electrode array is opaque to the predetermined type of electromagnetic radiation, the portions of the resist film 26 located behind (on) the second striped electrode array are not exposed to the predetermined type of electromagnetic radiation, and the other portions of the resist film 26 which fill the gaps between the linear electrodes constituting the second striped electrode array are exposed to the predetermined type of electromagnetic radiation. Therefore, the resist pattern 26a corresponding to the second striped electrode array can be formed by the exposure in the above stage (4).

Thereafter, in the process as the third embodiment of the present invention: (5) gap production processing is performed so as to produce gaps between the plurality of linear electrodes 24a and the resist pattern 26a, and expose the transparent conductive film 22 at the bottoms of the gaps; and (6) the transparent conductive film 22 is etched by using the resist pattern 26a and the second striped electrode array as a mask until the second striped electrode array is separated from the portions 22a of the transparent conductive film 22 realizing the linear electrodes constituting the first striped electrode array.

The process as the third embodiment of the present invention has the same advantages as the first embodiment.

Variations and Other Matters (i) In the first to third embodiments, the second striped electrode arrays may be made of any conductive material including unalloyed metals such as gold, silver, and platinum and alloyed metals such as indium oxide.

(ii) In the first to third embodiments, the transparent conductive films may be made of an $SnO_2$ film (which is known as a NESA film), an IZO film (such as an IDIXO film), or the like, where the IZO film is a transparent amorphous metal oxide. Preferably, the thickness of the $SnO_2$ film or the IZO film is 50 to 200 nm.

When the transparent conductive film in each of the first to third embodiments is made of a completely amorphous material such as IDIXO, underetching can proceed at a uniform etching rate at every location in the transparent conductive film. In this case, deep underetching becomes possible. For example, the first striped electrode array can be separated from the second striped electrode array with a distance of 10 micrometers by underetching. In addition, since the edges of the first striped electrode array are smoothed, charge injection from the edges of the first striped electrode array can be reduced.

Further, it is possible to produce a completely amorphous ITO film by precisely adding $H_2O$ to sputtering gas. When the transparent conductive film is made of a completely amorphous ITO film, it is possible to make the first striped electrode array alkali resistant.

(iii) When the underetching is used as above, it is preferable to form gaps of 1 to 7 micrometers between the first and second striped electrode arrays. More preferably, the gaps are 2 to 5 micrometers.

When the gaps between the first and second striped electrode arrays are within the above ranges, it is possible to prevent formation of a short circuit between the first and second striped electrode arrays, occurrence of a harmful phenomenon (such as noise production) caused by interaction between the first and second striped electrode arrays, and production of a harmful defect (such as a disconnection)

caused by excessive underetching. The above gaps are indicated with "A" in FIG. 5, with "B" in FIG. 10, and with "C" in FIG. 16.

(iv) The base or substrate may be made of an organic polymer such as PMMA (polymethyl methacrylate).

Figure 17:
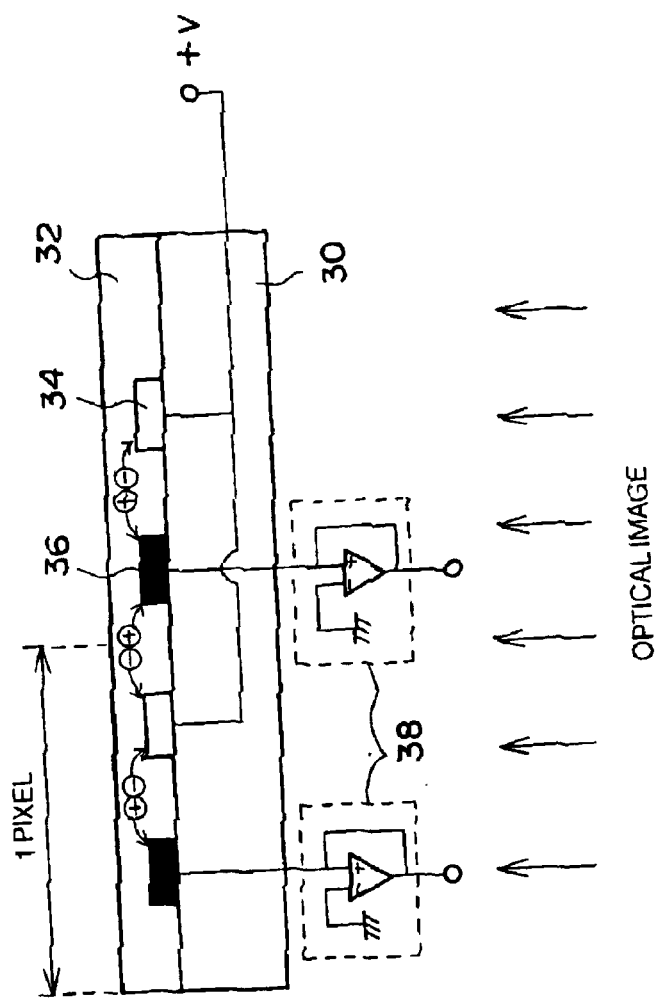
FIG. 17 is a cross-sectional view of a line sensor including an alternate striped electrode array produced by the process as one of the first to third embodiments of the present invention.

(v) The alternate striped electrode arrays produced by the processes as the first to third embodiments of the present invention can be used in a line sensor, for example, as illustrated in FIG. 17, which shows a partial cross section of a line sensor. The line sensor 40 illustrated in FIG. 17 is constructed by forming a photoconductive layer 32 on an alternate striped electrode array produced by the process as one of the first to third embodiments of the present invention.

In the example of FIG. 17, an adjacent pair of one of the linear electrodes constituting the first striped electrode array and one of the linear electrodes constituting the second striped electrode array corresponds to a pixel line. Alternatively, it is possible to arrange a line sensor so that a combination of more than one of the linear electrodes constituting the first striped electrode array and more than one of the linear electrodes constituting the second striped electrode array corresponds to a pixel line.

When light carrying an optical image is applied to the line sensor 40 of FIG. 17 from the lower surface of the glass substrate 30, charge pairs are generated in the photoconductive layer 32. The charge pairs can be read out as an image signal by applying a predetermined voltage to the first striped electrode array and connecting a current detection amplifier 38 to the second striped electrode array.

What is claimed is:

1. A process for producing an alternate striped electrode array which comprises first and second striped electrode arrays formed on a base transparent to a predetermined type of electromagnetic radiation, where the first striped electrode array includes a plurality of first linear electrodes, the second striped electrode array includes a plurality of second linear electrodes alternating with the plurality of first linear electrodes, the plurality of first linear electrodes are transparent to the predetermined type of electromagnetic radiation, the plurality of second linear electrodes are opaque to the predetermined type of electromagnetic radiation, the plurality of first linear electrodes and the plurality of second linear electrodes are arranged approximately parallel to each other, and said process comprises the steps of:

(a) forming said second striped electrode array on an upper surface of said base;

(b) forming a continuous, transparent conductive film on an upper surface of said base and an upper surface of said second striped electrode array;

(c) forming a continuous resist film on an upper surface of said transparent conductive film, where the resist film is negative with respect to said predetermined type of electromagnetic radiation;

(d) forming a resist pattern corresponding to said second striped electrode array by applying said predetermined type of electromagnetic radiation through a lower surface of said base to said resist film other than portions of said resist film which are masked by said second striped electrode array; and (e) etching said transparent conductive film by using said resist pattern as a mask so that a portion of said transparent conductive film which remains after etching is separated from said second striped electrode array and forms said first striped electrode array.

2. A process according to claim 1, wherein said transparent conductive film is made of a completely amorphous material.

3. A process for producing an alternate striped electrode array which comprises first and second striped electrode arrays formed on a base transparent to a predetermined type of electromagnetic radiation, where the first striped electrode array includes a plurality of first linear electrodes, the second striped electrode array includes a plurality of second linear electrodes alternating with the plurality of first linear electrodes, the plurality of first linear electrodes are transparent to the predetermined type of electromagnetic radiation, the plurality of second linear electrodes are opaque to the predetermined type of electromagnetic radiation, the plurality of first linear electrodes and the plurality of second linear electrodes are arranged approximately parallel to each other, and said process comprises the steps of:

(a) forming said second striped electrode array on an upper surface of said base;

(b) forming a continuous, transparent insulation film on an upper surface of said base and an upper surface of said second striped electrode array;

(c) forming a continuous, transparent conductive film on an upper surface of said transparent insulation film;

(d) forming a continuous resist film on an upper surface of said transparent conductive film, where the continuous resist film is negative with respect to said predetermined type of electromagnetic radiation;

(e) forming a resist pattern corresponding to said second striped electrode array by applying said predetermined type of electromagnetic radiation through a lower surface of said base to said continuous resist film other than portions of said continuous resist film which are masked by said second striped electrode array; and (f) etching said transparent conductive film by using said resist pattern as a mask so that a portion of said transparent conductive film which remains after etching forms said first striped electrode array.

4. A process according to claim 3, wherein said transparent conductive film is made of a completely amorphous material.

5. A process for producing an alternate striped electrode array which comprises first and second striped electrode arrays formed on a base transparent to a predetermined type of electromagnetic radiation, where the first striped electrode array includes a plurality of first linear electrodes, the second striped electrode array includes a plurality of second linear electrodes alternating with the plurality of first linear electrodes, the plurality of first linear electrodes are transparent to the predetermined type of electromagnetic radiation, the plurality of second linear electrodes are opaque to the predetermined type of electromagnetic radiation, the plurality of first linear electrodes and the plurality of second linear electrodes are arranged approximately parallel to each other, and said process comprises the steps of:

(a) forming a continuous, transparent conductive film on an upper surface of said base;

(b) forming said second striped electrode array on an upper surface of said transparent conductive film;

(c) forming a continuous resist film on an upper surface of said transparent conductive film and an upper surface of said second striped electrode array;

(d) forming a resist pattern corresponding to said second striped electrode array by applying said predetermined type of electromagnetic radiation through a lower surface of said base to said continuous resist film other than portions of said continuous resist film which are masked by said second striped electrode array;

(e) producing gaps between said resist pattern and said second striped electrode array so as to expose said transparent conductive film at bottoms of said gaps; and (f) etching said transparent conductive film by using said resist pattern and said second striped electrode array as a mask so that a portion of said transparent conductive film which remains after etching is separated from said second striped electrode array and forms said first striped electrode array.

6. A process according to claim 5, wherein said transparent conductive film is made of a completely amorphous material.

* * * * *